(12) United States Patent
Wang et al.

(10) Patent No.: US 6,686,856 B1
(45) Date of Patent: Feb. 3, 2004

(54) CLOCKING DOMAIN CONVERSION SYSTEM AND METHOD

(75) Inventors: Charles Wang, San Jose, CA (US); Miaobin Gao, San Jose, CA (US); Gladney Asada, San Jose, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/300,255

(22) Filed: Nov. 20, 2002

(51) Int. Cl.⁷ ................................. H03M 9/00

(52) U.S. Cl. ........................ 341/100; 341/101

(58) Field of Search ..................... 341/100, 101

(56) References Cited

U.S. PATENT DOCUMENTS

| | | | | |
|---|---|---|---|---|
| 5,349,612 A | * | 9/1994 | Guo et al. .................. | 375/371 |
| 5,490,282 A | | 2/1996 | Dreps et al. | |
| 5,648,776 A | | 7/1997 | Widmer | |
| 5,798,720 A | * | 8/1998 | Yano .......................... | 341/101 |
| 5,854,656 A | | 12/1998 | Noggle | |
| 5,982,309 A | * | 11/1999 | Xi et al. ..................... | 341/101 |
| 6,031,473 A | * | 2/2000 | Kubinec ...................... | 341/100 |
| 6,232,895 B1 | | 5/2001 | Djupsjobacka et al. | |
| 6,335,696 B1 | * | 1/2002 | Aoyagi et al. ............... | 341/100 |
| 6,420,989 B1 | * | 7/2002 | Herbold ...................... | 341/155 |
| 2002/0039211 A1 | | 4/2002 | Shen et al. | |

\* cited by examiner

Primary Examiner—Michael Tokar
Assistant Examiner—Khai Nguyen

(57) ABSTRACT

Systems and methods of converting data streams from one clocking domain to another are described. In one aspect, a clocking domain conversion system includes an input, an output, a routing circuit, and a clock generator. The input is operable to simultaneously load N input bits during each load cycle at an average rate $R_{IN}$, wherein N has an integer value of at least 1. The output is operable to simultaneously output M output bits during each output cycle at an average rate $R_{OUT}$, wherein M has an integer value of at least 1 and M≠N. The routing circuit is operable to route the N input bits from the input to the output at a clocking rate $R_{CLK}$ and with a dividing ratio K of the routing circuit data rate relative to the higher of the input and output data rates, given by $$K = \frac{N \cdot R_{CLK}}{M \cdot R_{OUT}}$$

if $R_{IN} < R_{OUT}$, and $K = \frac{M \cdot R_{CLK}}{N \cdot R_{IN}}$ if $R_{IN} > R_{OUT}$.

The clock generator is operable to generate a clock signal for controlling the routing circuit and characterized by a non-uniform sequence of pulses having an average period T between successive pulses, given by $$T = \frac{K}{R_{CLK}}.$$

27 Claims, 5 Drawing Sheets

CLOCKING DOMAIN CONVERSION SYSTEM AND METHOD

TECHNICAL FIELD

This invention relates to systems and methods of converting a data stream from one clocking domain to another.

BACKGROUND

In many computing and communication environments it is often necessary to convert a data stream from one clocking domain to another. For example, data typically is transmitted within an electronic device (e.g., a computer) in a parallel, relatively low-speed clocking domain, whereas data typically is transmitted between electronic devices in a serial, relatively high-speed clocking domain, especially over longer distances. Typically, serial-to-parallel converters (or deserializers) are used to convert serial data streams into parallel data streams and parallel-to-serial converters (or serializers) are used to convert parallel data streams into serial data streams. The data rate (or information rate) is equal to the product of the number of word bits transmitted in parallel and the word transmission rate. For serializers and deserializers the data rate at the input typically is the same as the data rate at the output. Accordingly, the input clocking rate typically is slower than the output clocking rate for a serializer, whereas the input clocking rate typically is faster than the output clocking rate for a deserializer.

Some serializers and deserializers operate at the serial clocking rate. Other serializers and deserializers include multiple channels, which allow-these circuits to operate at a fraction (e.g., one-half or one-quarter) of the serial clocking rate. These systems may be implemented with less expensive circuits that operate at lower power relative to serializers and deserializers that operate at the higher serial clocking rate.

SUMMARY

The invention features systems and methods of converting a data stream from one clocking domain to another.

In one aspect of the invention, a clocking domain conversion system includes an input, an output, a routing circuit, and a clock generator. The input is operable to simultaneously load N input bits during each load cycle at an average rate $R_{IN}$, wherein N has an integer value of at least 1. The output is operable to simultaneously output M output bits during each output cycle at an average rate $R_{OUT}$, wherein M has an integer value of at least 1 and M≠N. The routing circuit is operable to route the N input bits from the input to the output at a clocking rate $R_{CLK}$ and with a dividing ratio K of the routing circuit data rate relative to the higher of the input and output data rates, given by $$K = \frac{N \cdot R_{CLK}}{M \cdot R_{OUT}}$$

if $$R_{IN} < R_{OUT}, \text{ and } K = \frac{M \cdot R_{CLK}}{N \cdot R_{IN}} \text{ if } R_{IN} > R_{OUT}.$$

The clock generator is operable to generate a clock signal for controlling the routing circuit and characterized by a non-uniform sequence of pulses having an average period T between successive pulses, given by $$T = \frac{K}{R_{CLK}}.$$

In another aspect, the invention features a clocking domain conversion method in accordance with which, N input bits are simultaneously loaded into an input during each load cycle, wherein N has an integer value of at least 1. M output bits are simultaneously outputted from an output during each output cycle at a rate $R_{OUT}$, wherein M has an integer value of at least 1 and M≠N. The N input bits are routed from the input to the output at a clocking rate $R_{CLK}$ and with a dividing ratio K of the routing circuit data rate relative to the higher of the input and output data rates, given by $$K = \frac{N \cdot R_{CLK}}{M \cdot R_{OUT}} \text{ if } R_{IN} < R_{OUT},$$

and $$K = \frac{M \cdot R_{CLK}}{N \cdot R_{IN}} \text{ if } R_{IN} > R_{OUT}.$$

The the routing circuit is controlled with a clock signal characterized by a non-uniform sequence of pulses having an average period T between successive pulses, given by $$T = \frac{K}{R_{CLK}}.$$

In another aspect of the invention, a clocking domain conversion system includes an input, an output, a routing circuit, and a clock generator. The input is operable to simultaneously load N input bits during each load cycle, wherein N has an integer value of at least 1. The output is operable to simultaneously output M output bits during each output cycle at a rate $R_{OUT}$, wherein M has an integer value of at least 1 and M≠N. The routing circuit is operable to route the N input bits from the input to the output at a clocking rate $R_{CLK}$. The clock generator is operable to generate an input clock signal for controlling simultaneous loading of the N input bits during each load cycle and characterized by a non-uniform sequence of pulses.

In another aspect of the invention, a clocking domain conversion system includes an input, an output, a routing circuit, and a clock generator. The input is operable to simultaneously load N input bits during each load cycle, wherein N has an integer value of at least 1. The output is operable to simultaneously output M output bits during each output cycle at a rate $R_{OUT}$, wherein M has an integer value of at least 1 and M≠N. The routing circuit is operable to route the N input bits from the input to the output at a clocking rate $R_{CLK}$. The clock generator is operable to generate an output clock signal for controlling simultaneous outputting of the M output bits during each output cycle and characterized by a non-uniform sequence of pulses.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
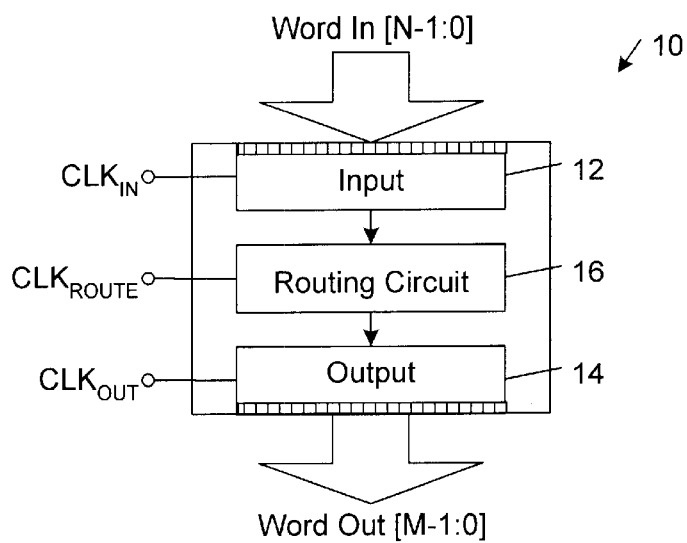
FIG. 1 is block diagram of a clocking domain conversion system that includes an input, an output, and a routing circuit.

Referring to FIG. 1, in one embodiment, a clocking domain conversion system 10 includes an input 12, an output 14, and a routing circuit 16. Input 12 is operable to simultaneously load N input bits ([N−1:0]) during each load cycle, where N has an integer value of at least 1. Output 14 is operable to simultaneously output M output bits ([M−1:0]) during each output cycle, where M has an integer value of at least 1; in some embodiments, M≠N. Routing circuit 16 is operable to route the N input bits from the input 12 to the output 14. The input loading cycles are clocked by an input clock signal ($CLK_{IN}$), the output outputting cycles are clocked by an output clock signal ($CLK_{OUT}$), and the routing circuit 16 is clocked by a routing clock signal ($CLK_{ROUTE}$). In the illustrated embodiment, the rate at which data is loaded into input 12 is the same as the rate at which data is outputted from output 14. That is, $$N \cdot R_{IN} = M \cdot R_{OUT} \quad (1)$$

where $R_{IN}$ is the average clock-in rate and $R_{OUT}$ is the average clock-out rate. Therefore, in the illustrated embodiment, clocking domain conversion system 10 is operable to convert the received input bits from the input clocking domain into a different output clocking domain (i.e., $R_{IN} \neq R_{OUT}$).

As explained in detail below, routing circuit 16 is operable to perform the clocking domain conversion at a clocking rate $R_{CLK}$, which may be different from the input clocking rate $R_{IN}$ or the output clocking rate $R_{OUT}$, or both. For example, routing circuit 16 may be clocked at a clocking rate that is slower than the higher of the input and output clocking rates $R_{IN}$, $R_{OUT}$. In this way, routing circuit 16 may operate with a longer cycle time and, therefore, a larger error margin than if the routing circuit operated at the higher of the input and output clocking rates $R_{IN}$, $R_{OUT}$. Routing circuit 16 also is operable to perform the clocking domain conversion with a dividing ratio K of the routing circuit data rate relative to the higher of the input and output data rates, given by:

$$K = \frac{N \cdot R_{CLK}}{M \cdot R_{OUT}}, \quad \text{if } R_{IN} < R_{OUT} \quad (2)$$

$$K = \frac{M \cdot R_{CLK}}{N \cdot R_{IN}}, \quad \text{if } R_{IN} > R_{OUT} \quad (3)$$

That is, the dividing ratio K is the ratio of the data rate through the clocking domain conversion system relative to the faster of the input and output data rates. The dividing ratio K may have an integer value or a non-integer value. By providing both integer and non-integer dividing ratio capability, the routing circuit 16 is able to flexibly convert a wide range of possible input-to-output bit conversion ratios (e.g., odd-bit conversion ratios) and ratios of internal-to-the faster of the input and output clocking rates (e.g., clocking rate ratios of one-half or one-quarter).

Figure 2:
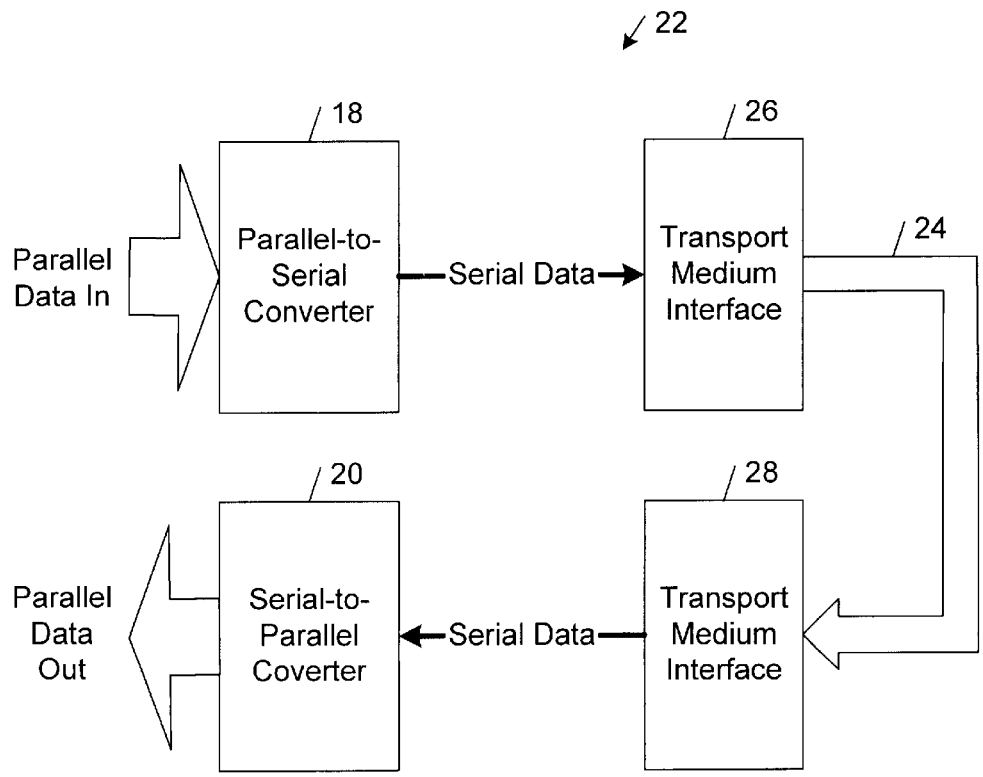
FIG. 2 is a diagrammatic view of a data transmission system that includes two clocking domain conversion systems.

Implementations of clocking domain conversion system 10 readily may be incorporated into any one of a wide variety of different application environments, including data communication systems. For example, referring to FIG. 2, clocking domain conversion system 10 may be implemented as a parallel-to-serial converter 18 (or serializer) and a serial-to-parallel converter 20 (or deserializer), both of which may be incorporated into a data communication system 22. Data communication system 22 may be an electrical transmission link or an optical transmission link. In an electrical transmission link implementation, data communication system 22 includes an electrical cable physical transport medium 24 and a pair of electrical-to-electrical transport medium interfaces 26, 28. In an optical transmission link implementation, the physical transport medium 24 is an optical fiber cable, and the transport medium interfaces 26, 28 are electrical-to-optical and optical-to-electrical interfaces, respectively. The parallel data input into the parallel-to-serial converter 18 may be encoded (e.g., error control and line coding). The encoded parallel data output from the serial-to-parallel converter 20 may be decoded by circuitry located downstream of the serial-to-parallel converter 20. The receiving end of data communication system 22 also may include a clock recovery circuit for recovering the original clocking signal to synchronize the parallel bit stream produced at the output of the serial-to-parallel converter 20 with the received serial bit stream.

Figure 3:
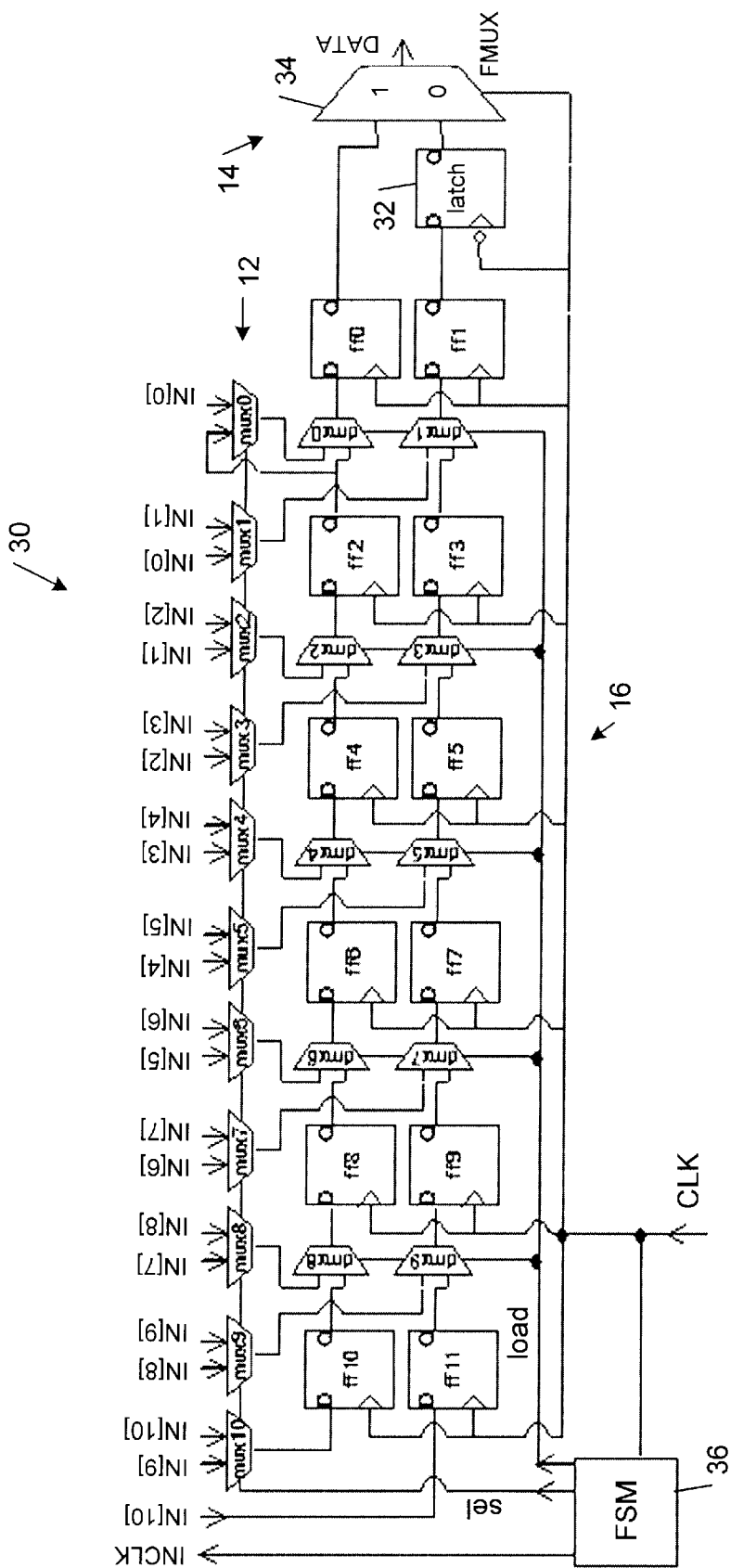
FIG. 3 is a circuit diagram of a parallel-to-serial converter.
Figure 4:
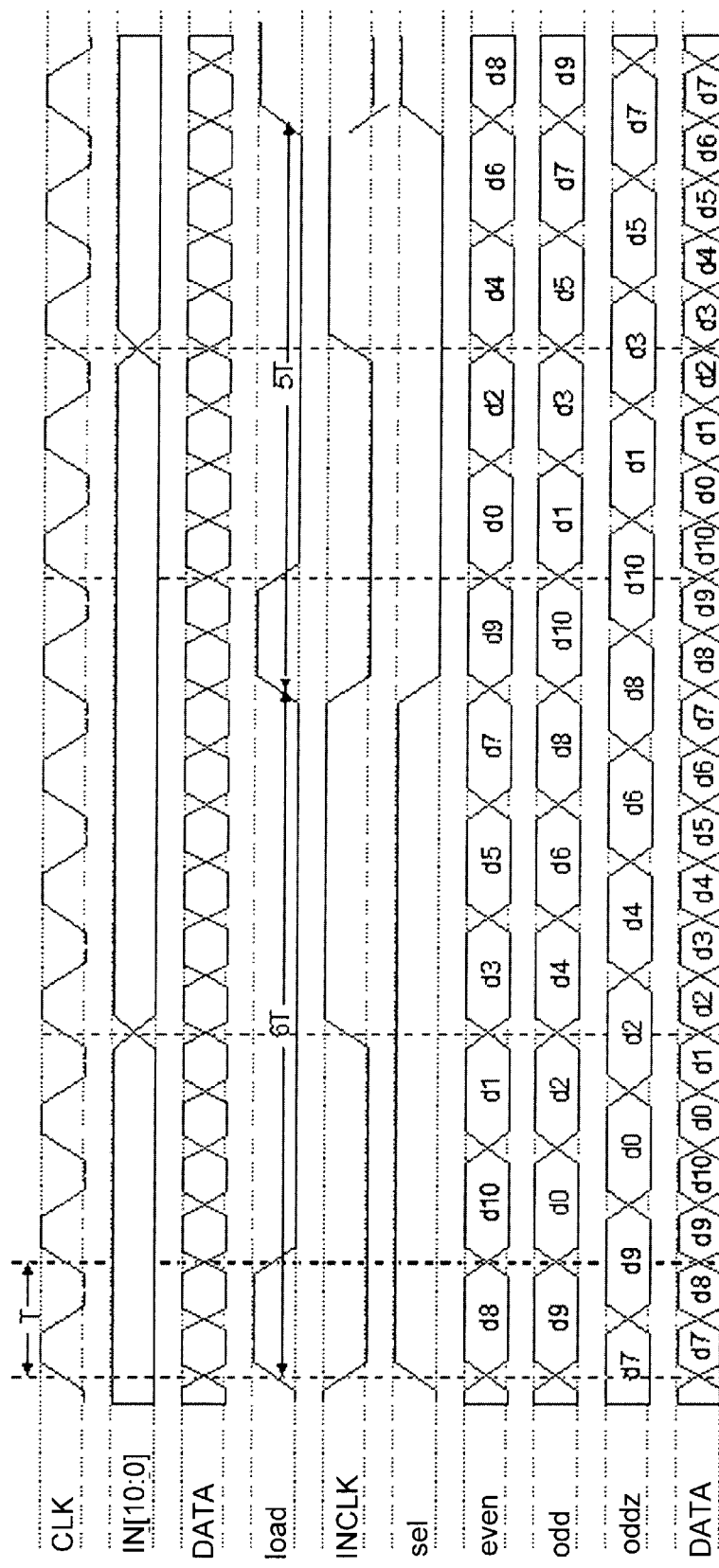
FIG. 4 is a timing diagram for the parallel-to-serial converter of FIG. 3.

Referring to FIGS. 3 and 4, in one embodiment, clocking domain conversion system 10 is implemented as an 11:1 parallel-to-serial converter 30. Input 12 of parallel-to-serial converter 30 includes eleven 2:1 multiplexers (mux0, . . . , mux10). Routing circuit 16 of parallel-to-serial converter 30 includes two parallel data channels of shift register banks (even bank: ff0, ff2, ff4, ff6, ff8, ff10; odd bank: ff1, ff3, ff5, ff7, ff9, ff11), ten demultiplexers (dmx0, . . . , dmx9), and one latch 32 (latch). The multiplexer outputs of input 12 are connected to the demultiplexers of routing circuit 16 to distribute input bits to the even and odd data channels in a bit-interleaved format, as shown. Output 14 of parallel-to-serial converter 30 includes a 2:1 double-edge output flip-flop consisting of latch 32 and multiplexer 34 (FMUX). The outputs of input multiplexers (mux0, mux1, . . . , and mux10) are selected by a "sel" signal that is generated by a clock generator 36. In particular, the "sel" signal selects which shift register bank (even or odd) will receive the first bit (d0) of each parallel word that is loaded during each load cycle. The set of input values (IN[0], . . . , IN[10]) that is passed from the input multiplexers to the routing circuit demultiplexers (dmx0, dmx1, . . . , and dmx9) is selected by a "load" signal that is generated by clock generator 36. The "load" signal causes the shift registers to load each word in parallel. In the illustrated embodiment, clock generator 36 is implemented as a finite state machine (FSM) using known digital circuit design techniques. In other embodiments, clock generator 36 may be implemented in any one of a wide variety of different conventional ways.

FIG. 4 shows the signal timing diagram that defines the operation of parallel-to-serial converter 30. Assuming the period of the CLK signal is T and its frequency is f, then f=1/T. Each parallel input word has 11 bits (d0, d1, ..., d10). The shift registers are loaded once every 6T, then 5T, alternatively. That is, the load clock signal for controlling simultaneous loading of the N =11 input bits during each load cycle is characterized by a non-uniform sequence of pulses having an average period $T_{LOAD}$ between successive pulses, given by:

$$T_{LOAD} = \frac{K}{R_{CLK}} \quad (4)$$

In the illustrated embodiment, using equation (2) the dividing ratio K is given by:

$$K = \frac{11 \cdot R_{CLK}}{1 \cdot 2 \times R_{CLK}} = 5.5 \quad (5)$$

Thus, substituting 5.5 for K and 1/T for $R_{CLK}$ in equation (4), the average input load cycle period $T_{LOAD}$ is 5.5T in the illustrated embodiment. Once a parallel word is loaded into the shift registers, it is shifted out using the rising edge of the CLK signal. The 2:1 output multiplexer 34 and the latch 32 generate the serial bit stream using both the rising and falling edges of the CLK signal. When the "load" signal switches from the 5T period to the 6T period, the last bit (d10) of the previous parallel word is preserved through "mux0" and "dmx0". The INCLK signal may be used to clock the input parallel word that is transmitted by circuitry upstream of parallel-to-serial converter 30.

Figure 5:
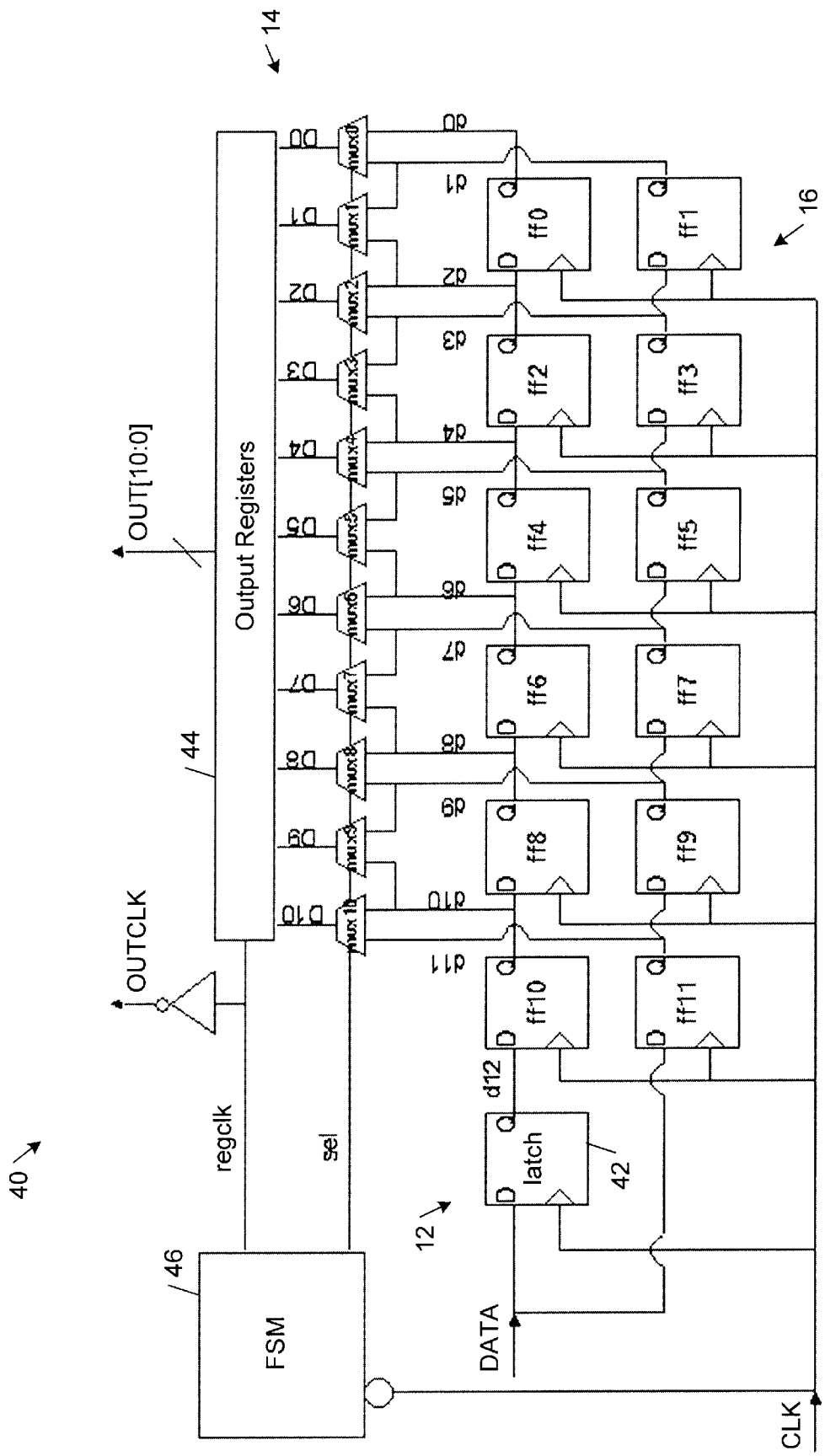
FIG. 5 is a circuit diagram of a serial-to-parallel converter.
Figure 6:
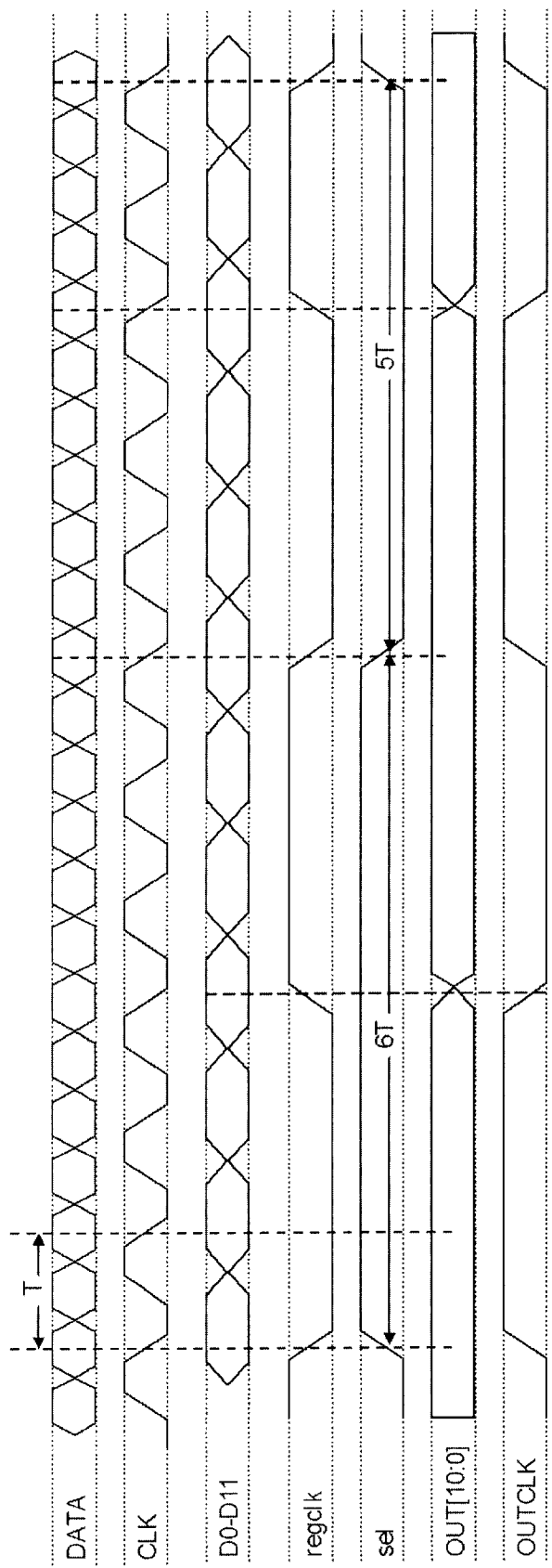
FIG. 6 is a timing diagram for the serial-to-parallel converter of FIG. 5.

Referring to FIGS. 5 and 6, in another embodiment, clocking domain conversion system 10 is implemented as an 1:11 serial-to-parallel converter 40. The serial-to-parallel converter 40 samples the input serial data (DATA) using both rising and falling edges of the CLK signal, creating two parallel data streams which are passed to two parallel data channels of routing circuit 16. In this embodiment, the data channels are implemented in the form of two parallel shift register banks (even bank: ff0, ff2, ff4, ff6, ff8, ff10; and odd bank: ff1, ff3, ff5, ff7, ff9, ff11). Latch 42 causes the falling edge of the CLK signal to latch the input serial data (DATA). The output 14 of serial-to-parallel converter 40 includes eleven 2:1 multiplexers (mux0, mux1, ... mux10) and a set 44 of parallel word output registers (Output Registers). A clock generator 46 generates a low-speed parallel data clock signal (regclk) and a select signal (sel) using the falling edge of the CLK signal. The "regclk" signal clocks the set 44 of output registers to output the 11 bits of the output word (OUT[10:0]) in parallel during each output cycle. The "sel" signal controls whether the first bit of the parallel output word (OUT[10:0]) is output from the even or odd shift register bank of routing circuit 16. In the illustrated embodiment, clock generator 46 is implemented as a finite state machine (FSM) using known digital circuit design techniques. In other embodiments, clock generator 46 may be implemented in any one of a wide variety of different conventional ways.

FIG. 6 shows the signal timing diagram that defines the operation of serial-to-parallel converter 40. Assuming the period of the CLK signal is T, the frequency is f=1/T. The output regclk signal clocks the M=11 parallel output word out once every 6T, then 5T, alternatively. That is, the output clock signal for controlling simultaneous outputting of the M=11 output bits during each output cycle is characterized by a non-uniform sequence of pulses having an average period $T_{OUT}$ between successive pulses, given by:

$$T_{OUT} = \frac{K}{R_{CLK}} \quad (6)$$

In the illustrated embodiment, the dividing ratio K is given by:

$$K = \frac{11 \cdot R_{CLK}}{1 \cdot 2 \times R_{CLK}} = 5.5 \quad (7)$$

Thus, substituting 5.5 for K and 1/T for $R_{CLK}$ in equation (6), the average output cycle period TOUT is 5.5T in the illustrated embodiment. The OUTCLK signal is the inversion of the regclk signal, and may be used to sample the parallel output word (OUT[10:0]) by circuitry downstream of the serial-to-parallel converter 40.

Other embodiments are within the scope of the claims.

What is claimed is:

1. A clocking domain conversion system, comprising:
   an input operable to simultaneously load N input bits during each load cycle at an average rate $R_{IN}$, wherein N has an integer value of at least 1;
   an output operable to simultaneously output M output bits during each output cycle at an average rate $R_{OUT}$, wherein M has an integer value of at least 1 and M≠N;
   a routing circuit operable to route the N input bits from the input to the output at a clocking rate $R_{CLK}$ and with a dividing ratio K of the routing circuit data rate relative to the higher of the input and output data rates, given by $$K = \frac{N \cdot R_{CLK}}{M \cdot R_{OUT}} \text{ if } R_{IN} < R_{OUT}, \text{ and } K = \frac{M \cdot R_{CLK}}{N \cdot R_{IN}} \text{ if } R_{IN} > R_{OUT};$$

and
   a clock generator operable to generate a clock signal for controlling the routing circuit and characterized by a non-uniform sequence of pulses having an average period T between successive pulses, given by $$T = \frac{K}{R_{CLK}}.$$

2. The system of claim 1, wherein K has a non-integer value.

3. The system of claim 1, wherein N>M, $R_{IN}$<$R_{OUT}$, and the routing circuit is operable to multiplex the N input bits into the M output bits.

4. The system of claim 3, wherein $R_{OUT}$=2×$R_{CLK}$.

5. The system of claim 4, wherein the output bits are outputted on both rising and falling edges of the clock.

6. The system of claim 4, wherein N has an odd integer value and M=1.

7. The system of claim 3, wherein the clock generator is operable to generate an input clock signal for controlling simultaneous loading of the N input bits during each load cycle.

8. The system of claim 3, wherein the input clock signal is characterized by successive pulses separated by relatively long periods and relatively short periods.

9. The system of claim 8, wherein the routing circuit is operable to deliver at least one input bit loaded during a relatively short period to the output during a subsequent relatively long period.

10. The system of claim 3, wherein the routing circuit comprises multiple data channels each operable to route a respective subset of the N input bits in parallel.

11. The system of claim 10, wherein each data channel comprises a respective set of shift register banks.

12. The system of claim 10, wherein the input is operable to pass a different respective subset of input bits to each data channel.

13. The system of claim 12, wherein the input is operable to cycle different subsets of input bits to each data channel over time.

14. The system of claim 13, wherein the input bits correspond to an ordered set of parallel bits, and the input is operable to distribute input bits to a first data channel and a second data channel in a bit-interleaved format.

15. The system of claim 1, wherein N<M, $R_{IN}$>$R_{OUT}$, and the routing circuit is operable to de-multiplex the N input bits into the M output bits.

16. The system of claim 15, wherein $R_{IN}$=2×$R_{CLK}$.

17. The system of claim 16, wherein the input bits is sampled on both rising and falling edges of a clock.

18. The system of claim 16, wherein N=1 and M has an odd integer value.

19. The system of claim 15, wherein the clock generator operable to generate an output clock signal for controlling simultaneous outputting of the M output bits during each output cycle.

20. The system of claim 19, wherein the output clock signal is characterized by successive pulses separated by relatively long periods and relatively short periods.

21. The system of claim 15, wherein the routing circuit comprises multiple data channels each operable to route a respective subset of the N input bits in parallel.

22. The system of claim 21, wherein each data channel comprises a respective set of shift register banks.

23. A clocking domain conversion system, comprising:
an input operable to simultaneously load N input bits during each load cycle, wherein N has an integer value of at least 1;
an output operable to simultaneously output M output bits during each output cycle at a rate $R_{OUT}$, wherein M has an integer value of at least 1 and M≠N;
a routing circuit operable to route the N input bits from the input to the output at a clocking rate $R_{CLK}$; and
a clock generator operable to generate an input clock signal for controlling simultaneous loading of the N input bits during each load cycle and characterized by a non-uniform sequence of pulses.

24. The system of claim 23, wherein the input clock signal has a non-integer average period between successive pulses.

25. A clocking domain conversion system, comprising:
an input operable to simultaneously load N input bits during each load cycle, wherein N has an integer value of at least 1;
an output operable to simultaneously output M output bits during each output cycle at a rate $R_{OUT}$, wherein M has an integer value of at least 1 and M≠N;
a routing circuit operable to route the N input bits from the input to the output at a clocking rate $R_{CLK}$; and
a clock generator operable to generate an output clock signal for controlling simultaneous outputting of the M output bits during each output cycle and characterized by a non-uniform sequence of pulses.

26. The system of claim 25, wherein the output clock signal has a non-integer average period between successive pulses.

27. A clocking domain conversion method, comprising:
simultaneously loading N input bits into an input during each load cycle, wherein N has an integer value of at least 1;
simultaneously outputting M output bits from an output during each output cycle at a rate $R_{OUT}$, wherein M has an integer value of at least 1 and M≠N;
routing the N input bits from the input to the output at a clocking rate $R_{CLK}$ and with a dividing ratio K of the routing circuit data rate relative to the higher of the input and output data rates, given by $$K = \frac{N \cdot R_{CLK}}{M \cdot R_{OUT}} \text{ if } R_{IN} < R_{OUT},$$

and $$K = \frac{M \cdot R_{CLK}}{N \cdot R_{IN}}, \text{ if } R_{IN} > R_{OUT};$$

and controlling the routing circuit with a clock signal characterized by a non-uniform sequence of pulses having an average period T between successive pulses, given by $$T = \frac{K}{R_{CLK}}.$$

* * * * *